(12) United States Patent
Takao et al.

(10) Patent No.: US 7,560,089 B2
(45) Date of Patent: Jul. 14, 2009

(54) ANISOTROPICALLY-SHAPED POWDER OF AN ALKALI METAL OXIDE COMPOUND

(75) Inventors: Hisaaki Takao, Aichi-ken (JP); Yasuyoshi Saito, Aichi-ken (JP); Toshihiko Tani, Aichi-ken (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 362 days.

(21) Appl. No.: 10/732,295

(22) Filed: Dec. 11, 2003

(65) Prior Publication Data

US 2004/0120881 A1     Jun. 24, 2004

Related U.S. Application Data

(62) Division of application No. 10/127,762, filed on Apr. 23, 2002, now Pat. No. 6,692,652.

(30) Foreign Application Priority Data

Apr. 23, 2001 (JP) ............................ 2001-124225

(51) Int. Cl.
  *C04B 35/00* (2006.01)
(52) U.S. Cl. .............. 423/594.7; 423/594.8; 423/594.15
(58) Field of Classification Search .............. 423/594.7, 423/594.8, 594.15
  See application file for complete search history.

(56) References Cited

U.S. PATENT DOCUMENTS

| 4,234,557 A | * | 11/1980 | Arendt et al. | ............. 423/594.8 |
| 5,846,505 A | * | 12/1998 | Saegusa | ...................... 423/263 |
| 6,093,338 A | | 7/2000 | Tani et al. | |
| 6,299,815 B1 | | 10/2001 | Kimura et al. | |
| 6,387,295 B1 | | 5/2002 | Saito | |
| 6,570,097 B2 | * | 5/2003 | Monde et al. | ............. 174/137 B |

FOREIGN PATENT DOCUMENTS

| EP | 0 714 850 | 6/1996 |
| JP | SHO 58-18916 | 2/1983 |
| JP | 10-53465 | 2/1998 |
| JP | HEI 10-114570 | 5/1998 |
| JP | HEI 10-158087 | 6/1998 |
| JP | 10245298 | 9/1998 |
| JP | 2000203935 | 7/2000 |
| JP | 2001-151567 | 6/2001 |

OTHER PUBLICATIONS

Rimskaya-Korsakova, et al., "Lueshite from carbonatites of the Kovdora massif" Zapiski Vserossiiskogo Mineralogicheskogo Obshchestva, 1963, no month, vol. 92, pp. 173-183.*
Translation of Japan 2000-203935, Jul. 25, 2000, pp. 1-24.*
Translation of Japan 10-245298, Sep. 14, 1998, pp. 1-27.*
Sato, et al., "Preparation of <110>-Textured BaTiO3 . . . Needlelike TiO2 Particles" 2007, no month, J. Amer. Ceramic Soc., vol. 90, No. 9, pp. 3005-3008.*
F. K. Lotgering, "Topotactical Reactions with Ferrimagnetic Oxides Having Hexagonal Crystal Structures-I", J. Inorg. Nucl. Chem., 1959, vol. 9, pp. 113-123,Pergamon Press Ltd., Printed in Northern Ireland.
Derwent Publications, AN 1993-224612, XP-002286191, JP 05148656, Jun. 15, 1993.
L. Egerton, et al., American Ceramic Society Bulletin, American Ceramic Society, vol. 47, No. 12, pp. 1151-1156, "Isostatically Hot-Pressed Sodium-Potassium Niobate Transducer Material for Ultrasonic Device", Dec. 1968.
R. E. Jaeger, et al., Journal of The American Ceramic Society, American Ceramic Society, XP-001179221, pp. 209-213, "Hot Pressing of Potassium-Sodium Niobates", May 1962.
XP-002285305, pp. 388-389, Ubersicht Uber Die Antimonate, "Gmelins Hanbuch Der Anorganischen Chemie, Antimon B", (General Survey on Antimonates), 1949 (with English translation).

* cited by examiner

*Primary Examiner*—Steven Bos
(74) *Attorney, Agent, or Firm*—Oblon, Spivak, McClelland, Maier & Neustadt, P.C.

(57) ABSTRACT

Grain oriented ceramics constituted of a polycrystalline body having a first perovskite-type alkali-pentavalent metal oxide compound as the main phase, in which a specific crystal plane of each grain constituting the polycrystalline body is oriented. The grain oriented ceramics are obtained by molding a mixture of a first anisotropically-shaped powder A of which developed plane has a lattice matching with a specific crystal plane of the first perovskite-type alkali-pentavalent metal oxide compound and a first reaction material capable of reacting with the first anisotropically-shaped powder A thereby forming at least the first perovskite-type alkali-pentavalent metal oxide compound such that the first anisotropically-shaped powder A is oriented, and by heating them.

7 Claims, 2 Drawing Sheets

ANISOTROPICALLY-SHAPED POWDER OF AN ALKALI METAL OXIDE COMPOUND

BACKGROUND OF THE INVENTION

1. Field of the Invention

This invention concerns grain oriented ceramics and a production process thereof, as well as an anisotropically-shaped powder A and a production process thereof. More in particular, it relates to grain oriented ceramics suitable as piezoelectric materials for use in the following devices: various types of sensors (e.g. acceleration sensors, piezoelectric sensors, ultrasonic sensors, electrical field sensors, temperature sensors, gas sensors, and knocking sensors); energy conversion devices (e.g. piezoelectric transducers); low-loss actuators or low-loss resonators (e.g. piezoelectric actuators, ultrasonic motors and resonators); capacitors; bimorph piezoelectric devices; vibration pick-up devices; piezoelectric microphones; piezoelectric ignition devices, sonars; piezoelectric buzzers; piezoelectric loud speakers; oscillators; and filters, or suitable as thermoelectric conversion materials or ionic conduction materials, and a production process of such grain oriented ceramics, as well as an anisotropically-shaped powder A suitable to produce such grain oriented ceramics and a production process of such a powder.

2. Description of the Related Art

A piezoelectric material is a material having a piezoelectric effect and is classified, depending on the forms, into single crystals, ceramics, thin films, polymers and composite materials. Among the piezoelectric materials described above, piezoelectric ceramics have been applied generally in the field of electronics or mechatronics since they have high performance and a high degree of flexibility in shape, and since it is easy to design materials for them.

Piezoelectric ceramics are poled polycrystals formed by so-called poling process, that is, by applying a direct current to ferroelectric ceramics and aligning the direction of polarization of the ferroelectric material in a predetermined direction. In order to align spontaneous polarization in a predetermined direction by a poling process in piezoelectric ceramics, a crystal structure of pseudo-isotropic perovskite is advantageous, because spontaneous polarization may be directed three-dimensionally in that structure. Therefore, most of piezoelectric ceramics in practical use are pseudo-isotropic perovskite type (regular perovskite type) ferroelectric ceramics.

Known isotropic perovskite type ferroelectric ceramics may include $Pb(Zr.Ti)O_3$ (hereinafter referred to as "PZT"), PZT ternary systems formed by adding lead-based complex perovskites to PZT, $BaTiO_3$, and $Bi_{0.5}Na_{0.5}TiO_3$ (hereinafter referred to as "BNT").

Among them, the lead-based piezoelectric ceramics typically represented by PZT have piezoelectric properties better than other piezoelectric ceramics and are predominant among piezoelectric ceramics in practical use at present. However, since they contain lead oxide (PbO) of high vapor pressure, they might put a large load on the environment. Therefore, low-lead or lead-free piezoelectric ceramics having piezoelectric properties equivalent to those of PZT have been demanded.

On the other hand, $BaTiO_3$ ceramics have piezoelectric properties superior to other lead-free piezoelectric materials, and are utilized in sonars, for example. Further, it has been known that some solid solutions of $BaTiO_3$ and other lead-free series perovskite compounds (BNT, for example) also show piezoelectric properties superior to others. Nevertheless, the piezoelectric properties of such lead-free piezoelectric ceramics is inferior to those of PZT.

In view of the above, for solving such problems, various proposals have been made so far. For example, Japanese Patent Application Unexamined Publication No. Hei 11-180769 discloses a piezoelectric ceramics material having a fundamental constitution of $(1-x)$ $BNT-BaTiO_3$ (where $x=0.06$ to $0.12$), and containing $0.5$ to $1.5\%$ by weight of rare earth element oxides (for example, $La_2O_3$, $Y_2O_3$ and $Yb_2O_3$).

Further, Japanese Patent Application Unexamined Publication No. 2000-272962 discloses a piezoelectric ceramics composition represented by the general formula: $\{Bi_{0.5}(Na_{1-x}K_x)_{0.5}\}TiO_3$ (where $0.2 < x \leqq 0.3$) and a piezoelectric ceramics composition containing 2 wt. % or less of additives ($Fe_2O_3$, $Cr_2O_3$, $MnO_2$, $NiO$ and $Nb_2O_3$, for example).

Further, Japanese Patent Application Unexamined Publication No. 2000-281443 discloses a piezoelectric ceramic composition which is mainly constituted of a tungsten bronze type complex oxide represented by the general formula: $xNaNbO_3$-$yBaNb_2O_6$-$zBiNb_3O_9$ (where $x+y+z=1$, $(x, y, z)$ are within a predetermined region of a three-component phase diagram), and which contains Bi at a ratio of 3 to 6 wt % with respect to the entire weight where it is converted to metal.

Further, Japanese Patent Application Unexamined Publication No. 2000-313664 filed by the present applicant discloses an alkali metal-containing niobate series piezoelectric ceramics composition formed by adding a compound containing one or more of elements selected from Cu, Li and Ta to a solid solution represented by the general formula: $K_{1-x}Na_xNbO_3$. (where $x=0$ to $0.8$).

Further, Japanese Patent Application Unexamined Publication No. Hei 11-60333 filed by the present applicant discloses piezoelectric ceramics which is constituted of perovskite type ceramics containing rhombohedral crystals as the end phase (for example, perovskite type ceramics in which $Bi_{0.5}K_{0.5}TiO_3$, $BaTiO_3$, $NaNbO_3$ or the like is solid solubilized to BNT), and which has a degree of orientation of 30% or more at the pseudo-cubic $\{100\}$ plane according to the Lotgering's method.

Further, the above-mentioned publication discloses a process of producing piezoelectric ceramics which includes the following steps: a step of mixing a host material A ($Ba_4Ti_3O_{12}$), any one of a guest material B (an equiaxial powder of $Bi_{0.5}(Na_{0.85}K_{0.15})_{0.5}TiO_3$) and a material Q, and a guest material C (a $Bi_2O_3$ powder, an $Na_2CO_3$ powder, a $K_2CO_3$ powder and a $TiO_2$ powder), where the host material A has a platelike shape and is composed of a layered perovskite type compound, the material B has an isotropic perovskite type structure, the material Q is capable of forming the guest material B, and the guest material C converts the host material A into an isotropic perovskite type compound; a step of molding the mixture such that the host material A is oriented; and a step of sintering the green body by heating.

It has been known that when a certain kind of additive is added to a lead-free isotropic perovskite compound such as $BaTiO_3$ or BNT, sinterability and piezoelectric properties are improved. This is also observed in isotropic perovskite type compounds typically represented by a perovskite-type alkali niobate compound ($K_{1-x}Na_xNbO_3$) in which the main ingredient of the A site element is K and/or Na and the main ingredient of the B site element is Nb, Sb and/or Ta (hereinafter referred to as a "first perovskite-type alkali-pentavalent metal oxide compound"), and sinterability and piezoelectric properties can be improved by optimizing the kind and the addition amount of the additives.

However, if the first perovskite-type alkali-pentavalent metal oxide compound is produced by an ordinary ceramics-production process in which simple compounds containing ingredient elements are used as starting materials to be calcinated, molded and sintered, each grain in the obtained sintered body is oriented at random. In this case, the resultant sintered body is deficient in piezoelectric properties accordingly, although a perovskite-type alkali-pentavalent metal oxide compound has excellent piezoelectric properties by nature.

Generally, it has been known that the piezoelectric properties of the isotropic perovskite type compounds are different depending on the direction of the crystallographic axis. Accordingly, when the crystallographic axis of high piezoelectric properties can be oriented in a predetermined direction, anisotropy of the piezoelectric properties can be utilized to the utmost degree and it can be expected to make the characteristics of the piezoelectric ceramics higher. Actually, it has been known that some single crystals composed of lead-free series ferroelectric materials show excellent piezoelectric properties.

However, single crystals involve a problem of high production cost. Further, single crystals of a solid solution of complicate composition such as a first perovskite-type alkali-pentavalent metal oxide compound tends to cause deviation of composition during production and is not suitable as practical materials. Further, since single crystals are poor in fracture toughness, they are difficult to be used under high stress, resulting in a limited range of applications.

On the other hand, platelike powder of a layered perovskite type compound (host material A) functions as a reactive template for forming an isotropic perovskite type compound as described in Japanese Patent Patent Application Unexamined Publication No. Hei 11-60333. Therefore, when the host material A is oriented in the green body and reacted with the guest material C, grain oriented ceramics in which a specific crystal plane is oriented at a high degree of orientation can be produced easily and at a reduced cost even from an isotropic perovskite type compound with less anisotropy of crystal lattice.

However, there have been no examples of applying the method described above to the first perovskite-type alkali-pentavalent metal oxide compound. Further, by this method, the isotropic perovskite compound (general formula: $ABO_3$) is formed by reaction between the host material A and the guest material C, and the A-site element (Bi) contained in the host material A ($Bi_4Ti_3O_{12}$) always remains in the composition of the resultant grain oriented ceramics. Therefore, this method cannot sometimes attain the most desired composition and the characteristics as the piezoelectric material may possibly be damaged by the A-site element contained inevitably.

SUMMARY OF THE INVENTION

This invention has been accomplished in view of the foregoing situations and has an object to provide grain oriented ceramics which has a high orientation degree and is composed of a first perovskite-type alkali-pentavalent metal oxide compound, as well as a production process thereof.

Another object of this invention is to provide an anisotropically-shaped powder A suitable as a reactive templete for producing the grain oriented ceramics described above, as well as a production process thereof.

To achieve the objects and in accordance with the purpose of the present invention, as embodied and broadly described herein, grain oriented ceramics according to this invention is constituted of a polycrystalline body of which main phase is a first perovskite-type alkali-pentavalent metal oxide compound, that is, an isotropic perovskite type compound represented by the general formula $ABO_3$, where a main ingredient for the A-site element is K and/or Na and a main ingredient for the B-site element is Nb, Sb and/or Ta, in which the specific crystal plane of each grain constituting the polycrystalline body is oriented.

Further, a process of producing grain oriented ceramics according to this invention includes a mixing step of mixing a first anisotropically-shaped powder A of which developed plane has lattice matching with the specific crystal plane of the first perovskite-type alkali-pentavalent metal oxide compound and a first reaction material capable of reacting with the first anisotropically-shaped powder A thereby forming at least the first perovskite-type alkali-pentavalent metal oxide compound, a molding step of molding the mixture obtained in the mixing step such that the first anisotropically-shaped powder A is oriented, and a heat treatment step of heating the green body obtained in the molding step thereby reacting the first anisotropically shaped powder A and the first reaction material.

The first anisotropically-shaped powder A satisfying a predetermined condition, when reacting with the first reaction material of predetermined composition, forms an anisotropic crystal composed of the first perovskite-type alkali-pentavalent metal oxide compound which has succeeded to the orientation direction of the first anisotropically-shaped powder A. Accordingly, orienting the anisotropically-shaped powder A in the green body and heating the green body to a predetermined temperature provide the grain oriented ceramics which is composed of the first perovskite-type alkali-pentavalent metal oxide compound, in which each crystal grain having a specific crystal plane as its developed plane is oriented in a predetermined direction.

Further, the anisotropically-shaped powder A according to this invention is composed of a second perovskite-type alkali-pentavalent metal oxide compound, that is, an isotropic perovskite type compound represented by a general formula $ABO_3$ where a main ingredient for the A-site element is K, Na, and/or Li and a main ingredient for the B-site element is Nb, Sb and/or Ta, and has a a specific crystal plane as its developed plane.

Further, the production process for the anisotropically-shaped powder A according to this invention includes heating, in a flux, a second anisotropically-shaped powder which is composed of a layered perovskite type compound and which has a developed plane having a lattice matching with the specific crystal plane of the second perovskite-type alkali-pentavalent metal oxide compound, together with a second reaction material capable of reacting with the second anisotropically-shaped powder, thereby forming an anisotropically-shaped powder A composed of at least the second perovskite-type alkali-pentavalent metal oxide compound.

The second anisotropically-shaped powder composed of the layered perovskite type compound, when reacting with the second reaction material of predetermined composition in an appropriate flux, brings forth an anisotropically-shaped powder A composed of the second perovskite-type alkali-pentavalent metal oxide compound which has succeeded to the orientation direction of the second anisotropically-shaped powder. Further, optimizing the compositions of the second anisotropically-shaped powder and the second reaction material provides an anisotropically-shaped powder A not containing the A-site element contained in the second anisotropically-shaped powder, being composed of the second perovskite-type alkali-pentavalent metal oxide compound, and having a developed plane at a specific crystal plane.

BRIEF DESCRIPTION OF THE DRAWINGS

The accompanying drawings, which are incorporated in and constitute part of this specification, illustrate embodiments of the present invention and, together with the description, serve to explain the objects, advantages and principles of the invention. In the drawings.

DETAILED DESCRIPTION OF PREFERRED EMBODIMENTS

Figure 1:
FIG. 1 is a scanning electron microscopic (SEM) image of a NaNbO$_3$ (hereinafter, referred to as a "NN") platelike powder obtained in Example 3.

Preferred embodiments of this invention are to be described in detail. The grain oriented ceramics according to this invention have a feature in having a polycrystalline body having the first perovskite-type alkali-pentavalent metal oxide compound as a main phase, and in that specified crystal plane of each of the grains constituting the polycrystalline body is oriented.

In the grain oriented ceramics according to this invention, the "first perovskite-type alkali-pentavalent metal oxide compound" is an isotropic perovskite type compound represented by the general formula: ABO$_3$ in which the main ingredient for the A-site element is K and/or Na, and the main ingredient for the B-site element is Nb, Sb and/or Ta as described above. Further, the "main ingredient" indicates that one or more of specified elements described above comprise 50 at % or more of the relevant site.

There is no particular restriction on the kind of the A-site elements other than K and Na and the B-site elements other than Nb, Sb and Ta contained in the first perovskite-type alkali-pentavalent metal oxide compound. That is, various elements may be incorporated so long as the isotropic perovskite type crystal structure can be maintained, and they do not give undesired effects on the properties such as sintering properties and piezoelectric properties.

Preferred examples of the A-site element contained as a sub-ingredient can specifically include a monovalent cation element (for example, Li$^+$, Ag$^+$, Cs$^+$). Further, preferred examples of the B-site element contained as a sub-ingredient can specifically include a pentavalent cation element (for example, Nb$^{5+}$, Sb$^{5+}$, Ta$^{5+}$).

Further, the A-site element and the B-site element contained as the sub-ingredient may be such a combination that the sum of the valency makes a hexavalency. They can preferably include a combination of Ba$^{2+}$ and Ti$^{4+}$, a combination of Sr$^{2+}$ and Ti$^{4+}$ or a combination of Ca$^{2+}$ and Ti$^{4+}$, and the like. Further, as the sub-ingredient for the B-site element, only the hexavalent metal element (for example, W$^{6+}$, Mo$^{6+}$) may be contained. In this case, a defect is formed to the A-site such that the entire valency of the cation elements is hexavalent.

Further, "having the first perovskite-type alkali-pentavalent metal oxide compound as the main phase" indicates that the ratio of the first perovskite-type alkali-pentavalent metal oxide compound in the entire grain oriented ceramics is 90 vol% or more. In this case, the sub-phase is constituted of, for example, additives, sintering additives, by-products and impurities (for example Bi$_2$O$_3$, CuO, MnO$_2$, NiO) derived from the production process or the starting material to be used, which will be described later. Further, it is preferred that the content of, the sub-phase which may possibly give undesired effects on the properties be as small as possible.

Further, the "orientation of the specified crystal plane" indicates that each of the grains is arranged such that specified crystal planes of the first perovskite-type alkali-pentavalent metal oxide compound are in parallel with each other (such a state is hereinafter referred to as "plane oriented") or that specified crystal planes are arranged in parallel to one axis passing through the green body (such a state is hereinafter referred to as "axially oriented").

There is no particular restriction on the type of the oriented crystal plane, and it is selected in accordance with the direction of the spontaneous polarization of the first perovskite-type alkali-pentavalent metal oxide compound, application of the grain oriented ceramics, required properties, or the like. That is, the oriented crystal plane is selected in accordance with the purpose such as a pseudo-cubic {100} plane, a pseudo-cubic {110} plane and a pseudo-cubic {111} plane.

Generally, an isotropic perovskite type compound takes a structure slightly strained from the cubic crystal, such as a tetragonal crystal, orthorhombic crystal or trigonal crystal. Since the strain is slight, it is regarded as the cubic crystal and expressed by mirror index as "pseudo-cubic {HKL}".

Generally, higher properties can be obtained as the ratio of the oriented grains increases. For example, in the case where a specified crystal plane is plane-oriented, in order to obtain high piezoelectric properties, the average orientation degree F(HKL) by the Lotgering's method represented by the following equation 1 is preferably 30% or more, and more preferably 50% or more.

$$F(HKL) = \frac{\frac{\sum' I(HKL)}{\sum I(hkl)} - \frac{\sum' I_0(HKL)}{\sum I_0(hkl)}}{1 - \frac{\sum' I_0(HKL)}{\sum I_0(hkl)}} \times 100(\%) \quad \text{[Equation 1]}$$

In the equation 1, $\Sigma I(hk1)$ is a total sum of the X-ray diffraction intensity of all crystal planes (hk1) measured for the grain oriented ceramics, while $\Sigma I_0(hk1)$ is the total sum of the X-ray diffraction intensity of all crystal planes (hk1) measured for not-oriented ceramics having the same composition as the grain oriented ceramics. Further, $\Sigma' I(HKL)$ is a total sum of the X-ray diffraction intensity of specified crystal planes (HKL) being crystallographically equivalent and measured for grain oriented ceramics, and $\Sigma' I_0(HKL)$ is the total sum of the X-ray diffraction intensity of specified crystal planes (HKL) being crystallographically equivalent and measured for not-oriented ceramics having the same composition as the grain oriented ceramics.

Then, the function of the grain oriented ceramics according to this invention is to be explained. Since the grain oriented ceramics according to this invention have a polycrystalline body having the first perovskite-type alkali-pentavalent metal oxide compound as the main phase, they show high piezoelectric properties among lead-free piezoelectric ceramics. Further, in the grain oriented ceramics according to this invention, since the specified crystal plane of each of the grains constituting the polycrystalline body is oriented in one direction, they show higher piezoelectric properties compared with the not-oriented polycrystalline body having the same composition.

Then, the anisotropically-shaped powder A according to this invention is to be explained. The anisotropically-shaped powder A according to this invention is constituted of the second perovskite-type alkali-pentavalent metal oxide compound in which the main ingredient for the A-site element is K, Na and/or Li, and the main ingredient for the B-site element is Nb, Sb and/or Ta, and the specified crystal plane constitutes a developed plane. It should be noted that a description of other respects to the second perovskite-type alkali-pentavalent metal oxide compound will be omitted since it is the same as the case of the first perovskite-type alkali-pentavalent metal oxide compound, except that Li may be contained as the main ingredient of the A-site element.

An "anisotropic shape" means that the longitudinal size is larger compared with the size in the lateral direction or the direction of the thickness. Specifically, the shape can preferably include platelike, columnar, flaky shape, or the like. Further, the "developed plane" is a plane occupying the largest area. The kind of the crystal plane constituting the developed plane is selected from a pseudo-cubic {100} plane, a pseudo-cubic {110} plane, a pseudo-cubic {111} plane, and the like in accordance with the purpose.

In the case where the anisotropically-shaped powder A according to this invention is used as a reactive template for producing the grain oriented ceramics consistent with this invention, it is necessary that the average aspect ratio of the anisotropically-shaped powder A (=an average value of (longitudinal size of anisotropically-shaped powder)/(size in the lateral direction or thickness direction)) is at least 3 or more. When the average aspect ratio is less than 3, it is not preferred since orientation in one certain direction becomes difficult during molding. For obtaining grain oriented ceramics with high orientation degree, the average aspect ratio of the anisotropically-shaped powder A is preferably 5 or more, and more preferably 10 or more.

Generally, as the average aspect ratio of the anisotropically-shaped powder A is larger, orientation of the anisotropically-shaped powder A during molding tends to be facilitated. However, when the average aspect ratio is excessively large, the anisotropically-shaped powder A may be pulverized in the mixing step which will be described later, and a green body in which the anisotropically-shaped powder A is oriented may not be obtained. Accordingly, it is preferred that the average aspect ratio of the anisotropically-shaped powder A be 100 or less.

Further, the average particle size of the anisotropically-shaped powder A (an average value in the longitudinal direction) is preferably 0.05 μm or more. When the average particle size of the anisotropically-shaped powder A is less than 0.05 μm, it becomes difficult to orient the anisotropically-shaped powder A in a certain direction under the shear stress given during molding. Further, since the gain of the interfacial energy decreases, when the powder is used as the reactive template upon production of grain oriented ceramics, epitaxial grown to the template grains is less likely to be caused.

On the other hand, the average particle size of the anisotropically-shaped powder A is preferably 20 μm or less. When the average particle size of the anisotropically-shaped powder A exceeds 20 μm, the sinterability is deteriorated, and grain oriented ceramics having high sintered density cannot be obtained. The average particle size of the anisotropically-shaped powder A is more preferably 0.1 μm or more and 10 μm or less.

Since the anisotropically-shaped powder A according to this invention is constituted of the second perovskite-type alkali-pentavalent metal oxide compound, it naturally has good lattice matching with the main phase of the grain oriented ceramics according to this invention. Therefore, when the anisotropically-shaped powder A is used as the reactive template, the grain oriented ceramics according to this invention can be produced easily.

Then, the production process of the anisotropically-shaped powder A according to this invention is to be described. Since the second perovskite-type alkali-pentavalent metal oxide compound has extremely small anisotropy of the crystal lattice, it is difficult to directly synthesize an anisotropically-shaped powder A having a specified crystal plane as its developed plane.

However, the anisotropically-shaped powder A constituted of the second perovskite-type alkali-pentavalent metal oxide compound (hereinafter referred to as "anisotropically-shaped powder A") can be produced by using a second anisotropically-shaped powder satisfying a predetermined condition as a reactive template and heating the same with a second reaction material satisfying a predetermined condition in a flux.

The "second anisotropically-shaped powder" means a powder constituted of a layered perovskite type compound in which the developed plane thereof has lattice matching with a specified crystal plane of the second perovskite-type alkali-pentavalent metal oxide compound.

The layered perovskite type compound is used as the second anisotropically-shaped powder because it makes the preparation of a powder having shape anisotropy relatively easy due to its large anisotropy of a crystal lattice. Further, the lattice matching is required because in the case where the developed plane of the anisotropically-shaped powder has no lattice matching with the specified crystal plane of the second perovskite-type alkali-pentavalent metal oxide compound, even the powder which is constituted of the layered perovskite type compound and has shape anisotropy does not function as the reaction template for synthesizing the anisotropically-shaped powder A.

The adequacy of the lattice matching can be expressed by a value obtained by dividing an absolute value of a difference between the lattice size of the developed plane of the second anisotropically-shaped powdernd a lattice size of the specified crystal plane of the second perovskite-type alkali-pentavalent metal oxide compound by a lattice size of the developed plane of the second anisotropically-shaped powder (hereinafter, the value is referred to as a "lattice matching ratio"). A smaller value of the lattice matching ratio indicates that the second anisotropically-shaped powder functions as a better reactive template. For efficiently producing the anisotropically-shaped powder A, the lattice matching ratio of the second anisotropically-shaped powder is preferably 20% or less, and more preferably 10% or less.

Further, in the case where the anisotropically-shaped powder A is synthesized by reacting the second anisotropically-shaped powder with the second reaction material in the flux, when the reaction condition is optimized, only the crystal structure changes, but the powder shape scarcely changes. Further, the average grain size and/or the aspect ratio of the second anisotropically-shaped powder is usually maintained as it is before and after reaction, but the average grain size and/or the aspect ratio of the resultant anisotropically-shaped powder A can also be increased or decreased by optimizing the reaction condition.

However, for easily synthesizing the anisotropically-shaped powder A that can be oriented easily in one direction upon molding, it is desirable that the second anisotropically-shaped powder used for the synthesis also have a shape which can be oriented easily in one direction upon molding.

That is, the average aspect ratio of the second anisotropically-shaped powder is preferably at least 3 or more, and more preferably 5 or more, and further preferably 10 or more. Further, for suppressing pulverization in the subsequent step, the average aspect ratio is preferably 100 or less. Further, the average particle size of the second anisotropically-shaped powder is preferably 0.05 μm or more and 20 μm or less, and more preferably 0.1 μm or more and 10 μm or less.

Preferred examples of the layered perovskite type compound suitable as the material for the second anisotropically-shaped powder may specifically include the bismuth layered perovskite type compounds having the composition represented by the following chemical formula 1:

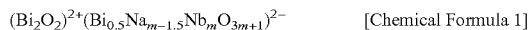   [Chemical Formula 1]

(where m is an integer of 2 or greater).

In the compound represented by the chemical formula 1, since the surface energy of the {001} plane is lower than that of other crystal planes, the second anisotropically-shaped powder with the {001} plane as the developed plane can be synthesized easily. The {001} plane is a plane parallel to the $(Bi_2O_2)^{2+}$ layer in the compound represented by the chemical formula 1. In addition, the {001} plane of the compound represented by the chemical formula 1 has excellent lattice matching with the pseudo-cubic {100} plane of the second perovskite-type alkali-pentavalent metal oxide compound.

Accordingly, the second anisotropically-shaped powder having the compound represented by the chemical formula 1 and having the {001} plane as the developed plane is suitable as a reactive template for producing the anisotropically-shaped powder A having the {100} plane as the developed plane. Further, when the compound represented by the chemical formula 1 is used, an anisotropically-shaped powder A not substantially containing Bi as the A-site element can also be synthesized by optimizing the composition of the second reaction material.

Preferred examples of the material for the second anisotropically-shaped powder may also include the bismuth layered perovskite type compounds represented by the following chemical formula 2:

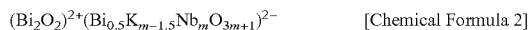   [Chemical Formula 2]

(Where, m is an integer of 2 or greater.)

A compound represented by the chemical formula 2 has the same effect as the compound represented by the chemical formula 1, and it is suitable as the reaction template for producing the anisotropically-shaped powder A. It should be noted that the second anisotropically-shaped powder in which Li and/or K have substituted for part of or the whole of the Na site in the bismuth layered perovskite type compound represented by the chemical formula 1 also has the same effect as the second anisotropically-shaped powder represented by the chemical formula 1, and it is suitable as the reactive template for producing the anisotropically-shaped powder A.

Another example of the layered perovskite type compound suitable as the material for the second anisotropically-shaped powder may include $Sr_2Nb_2O_7$. The {010} plane of $Sr_2Nb_2O_7$ has a surface energy lower than that of other crystal plane and has excellent lattice matching with the pseudo-cubic {110} plane of the second perovskite-type alkali-pentavalent metal oxide compound. Accordingly, the anisotropically-shaped powder constituted of $Sr_2Nb_2O_7$ and having the {010} plane as the developed plane is suitable as a reactive template for producing the anisotropically-shaped powder A having the {110} plane as the developed plane.

In addition, preferred examples of the layered perovskite type compounds having the lattice matching with the pseudo-cubic {100} plane of the second perovskite-type alkali-pentavalent metal oxide compound may specifically include $Na_{1.5}Bi_{2.5}Nb_3O_{12}$, $Na_{2.5}Bi_{2.5}Nb_4O_{15}$, $Bi_3TiNbO_9$, $Bi_3TiTaO_9$, $K_{0.5}Bi_{2.5}Nb_2O_9$, $CaBi_2Nb_2O_9$, $SrBi_2Nb_2O_9$, $BaBi_2Nb_2O_9$, $BaBi_3Ti_2NbO_{12}$, $CaBi_2Ta_2O_9$, $SrBi_2Ta_2O_9$, $BaBi_2Ta_2O_9$, $Na_{0.5}Bi_{2.5}Ta_2O_9$, $Bi_7Ti_4NbO_{21}$, $Bi_5Nb_3O_{15}$ and the like. Further, preferred examples of the layered perovskite type compound having the lattice matching with the pseudo-cubic {110} plane of the second perovskite-type alkali-pentavalent metal oxide compound may specifically include $Ca_2Nb_2O_7$, $Sr_2Ta_2O_7$, and the like.

The second anisotropically-shaped powder having such composition and the average particle size and/or the aspect ratio can be produced easily by heating a starting material containing ingredient elements of the second anisotropically-shaped powder such as an oxide, a carbonate, a nitrate, or the like (hereinafter, referred to as a "forming material for the anisotropically-shaped powder") together with a liquid or a material liquefied by heat. When the forming material for the anisotropically-shaped powder is heated in a liquid phase in which atoms diffuse easily, the second anisotropically-shaped powder in which a surface with lower surface energy (the {001} plane in the case of the material represented by the chemical formula 1 or 2) is predominantly developed can be synthesized easily. In this case, the average aspect ratio and the average particle size of the second anisotropically-shaped powder can be controlled by properly selecting the synthesis conditions.

Preferred examples for the production process of the second anisotropically-shaped powder may specifically include a method of adding an appropriate flux (for example, NaCl, KCl, a mixture of NaCl and KCl, $BaCl_2$ and KF) to the forming material for the anisotropically-shaped powder and heating them at a predetermined temperature (the flux method), a method of heating a powder of an indefinite shape having the same composition as that of the second anisotropically-shaped powder to be prepared together with an aqueous alkali solution in an autoclave (hydrothermal synthesis), and the like.

Further, the "second reaction material" means a material capable of reacting with the second anisotropically-shaped powder mentioned above, thereby forming an anisotropically-shaped powder A at least constituted of the second perovskite-type alkali-pentavalent metal oxide compound. In this case, the second reaction material may be a material forming only the second perovskite-type alkali-pentavalent metal oxide compound by the reaction with the second anisotropically-shaped powder, or may be a material forming both the second perovskite-type alkali-pentavalent metal oxide compound and a surplus ingredient. In this case, the surplus ingredient is not a material such as a desired second perovskite-type alkali-pentavalent metal oxide compound. Further, in the case where the surplus ingredient is formed from the second anisotropically-shaped powdernd the second reaction material, it is preferred that the surplus ingredient be easily removed thermally or chemically.

There is no particular restriction on the form of the second starting material and for example, oxide powder, complex oxide powder, salt such as a carbonate, a nitrate and an oxalate, and an alkoxide can be used. Further, the composition of the second reaction material is determined depending on the composition of the second perovskite-type alkali-pentavalent metal oxide compound to be prepared and the composition of the second anisotropically-shaped powder.

For instance, in the case of synthesizing an anisotropically-shaped powder A constituted of NN which is a kind of the second perovskite-type alkali-pentavalent metal oxide compound by using a second anisotropically-shaped powder constituted of $Bi_{2.5}Na_{0.5}Nb_2O_9$ (hereinafter, referred to as "BINN2") as a kind of the bismuth layered perovskite compound represented by the chemical formula 1, an Na-containing compound (oxide, hydroxide, carbonate, nitrate and the like) may be used as the second reaction material. In this case, an Na-containing compound corresponding to 1.5 mol of Na atoms relative to 1 mol of BINN2 may be added as the second reaction material.

When 1 wt % to 500 wt % of an appropriate flux (for example, NaCl, KCl, a mixture of NaCl and KCl, $BaCl_2$, KF and the like) is added to the second anisotropically-shaped powdernd the second reaction material having the composition described above and heated to an eutectic point/melting point, NN and a surplus ingredient mainly constituted of $Bi_2O_3$ is formed. Since $Bi_2O_3$ has low melting point and is also soluble to acid, an anisotropically-shaped powder A constituted of NN having the {100} plane as its developed plane can be obtained by removing the flux from the resultant reaction product with a hot water bath and then heating the same at a high temperature or washing with acid.

Further in the case of synthesizing an anisotropically-shaped powder A constituted of $K_{0.5}Na_{0.5}NbO_3$ (hereinafter, referred to as "KNN") as a kind of the second perovskite-type alkali-pentavalent metal oxide compound by using the second anisotropically-shaped powder, for example, constituted of BINN2, a compound containing Na (oxide, hydroxide, carbonate, nitrate and the like) and a compound containing K (oxide, hydroxide, carbonate, nitrate and the like) or a compound containing both Na and K may be used as the second reaction material. In this case, an Na-containing compound corresponding to 0.5 mol as Na atoms and a K-containing compound corresponding to 1 mol as K atoms relative to 1 mol of BINN2 may be added as the second reaction material.

When 1 wt % to 500 wt % of an appropriate flux is added to the second anisotropically-shaped powdernd the second reaction material having such composition and heated to an eutectic/melting point, since KNN and a surplus ingredient mainly constituted of $Bi_2O_3$ is formed, an anisotropically-shaped powder A constituted of KNN having the {100} plane as the developed plane can be obtained by removing the flux and $Bi_2O_3$ from the resultant reaction product.

In the case where only the second perovskite-type alkali-pentavalent metal oxide compound formed by the reaction of the second anisotropically-shaped powdernd the second reaction material is formed, the above process may be conducted in the same manner by heating the second anisotropically-shaped powder having a predetermined composition and the second reaction material having a predetermined composition in an appropriate flux. Thus, the second perovskite-type alkali-pentavalent metal oxide compound having an aimed composition is formed in the flux. Further, when the flux is removed from the resultant reaction product, the anisotropically-shaped powder A constituted of the second perovskite-type alkali-pentavalent metal oxide compound and having a specified crystal plane as its developed plane can be obtained.

Next, the function of the production process of the anisotropically-shaped powder A according to this invention is to be described. Since the second perovskite-type alkali-pentavalent metal oxide compound has small anisotropy of crystal lattice, it is difficult to directly form an anisotropically-shaped powder A. Further, it is also difficult to directly synthesize the anisotropically-shaped powder A having an arbitrary crystal plane as its developed plane.

On the other hand, since a layered perovskite type compound has large anisotropy of crystal lattice, the anisotropically-shaped powder can be directly synthesized easily. The developed plane of the anisotropically-shaped powder constituted of the layered perovskite compound often has lattice matching with a specified crystal plane of the second perovskite-type alkali-pentavalent metal oxide compound. Further, the second perovskite-type alkali-pentavalent metal oxide compound is thermo-dynamically stable compared with the layered perovskite compound.

Therefore, when a second anisotropically-shaped powder constituted of a layered perovskite compound with the developed plane thereof having a lattice matching with a specified crystal plane of the second perovskite-type alkali-pentavalent metal oxide compound is reacted with a second reaction material in an appropriate flux, the second anisotropically-shaped powder functions as a reactive template and an anisotropically-shaped powder A of the second perovskite-type alkali-pentavalent metal oxide compound that succeeds the orientation direction of the second anisotropically-shaped powder can be synthesized easily.

Further, when the composition of the second anisotropically-shaped powdernd the second reaction material is optimized, the A-site element contained in the second anisotropically-shaped powder (hereinafter, referred to as "surplus A-site element") is discharged as a surplus ingredient, and an anisotropically-shaped powder A constituted of the second perovskite-type alkali-pentavalent metal oxide compound not containing the surplus A-site element is formed.

Particularly, in the case of using the bismuth layered perovskite-type compound shown by the chemical formula 1, or the aforesaid compound in which K and/or Li have substituted for part of or the whole of the Na site, as the second anisotropically-shaped powder, Bi is discharged as the surplus A-site element to form a surplus ingredient mainly constituted of $Bi_2O_3$. Accordingly, when the surplus ingredient is removed thermally or chemically, it is possible to obtain an anisotropically-shaped powder A not substantially containing Bi, constituted of the second perovskite-type alkali-pentavalent metal oxide compound, and having a specified crystal plane as its developed plane.

Next, a production process of grain oriented ceramics according to this invention is to be described. The production process of the grain oriented ceramics according to this invention includes a mixing step, a molding step and a heat treatment step.

At first, the mixing step is to be described. In the mixing step, a first anisotropically-shaped powder and a first reaction material are mixed. The "first anisotropically-shaped powder" means a powder in which the developed plane has a lattice matching with a specified crystal plane of the first perovskite-type alkali-pentavalent metal oxide compound. As the first anisotropically-shaped powder, the anisotropically-shaped powder A or the second anisotropically-shaped powder described above can be used specifically.

The "first reaction material" means a material capable of reacting with the first anisotropically-shaped powder, thereby forming at least the first perovskite-type alkali-pentavalent metal oxide compound. In this case, the first reaction material may be a material forming only the first perovskite-type alkali-pentavalent metal oxide compound by the reaction with the first anisotropically-shaped powder, or a material forming both the first perovskite-type alkali-pentavalent metal oxide compound and the surplus ingredient. Further, in the case where the surplus ingredient is formed by the reaction of the first anisotropically-shaped powder and the first reaction material, it is preferred that the surplus ingredient be easily removed thermally or chemically.

The composition of the first reaction material is determined depending on the composition of the first anisotropically-shaped powder and the composition of the first perovskite-type alkali-pentavalent metal oxide compound to be prepared. Further, there is no particular restriction on the form of the first reaction material, and oxide powder, complex oxide powder, salt such as a carbonate, a nitrate or an oxalate and an alkoxide may be used.

For example, in the case of producing grain oriented ceramics having KNN composition by using an anisotropically-shaped powder A having the KNN composition as the first anisotropically-shaped powder, a mixture of a K-containing compound, an Na-containing compound and an Nb-containing compound blended in a stoichiometric ratio to be the KNN composition may be used as the first reaction material.

Further, in the case of producing grain oriented ceramics having the KNN composition, for example, by using an anisotropically-shaped powder A having NN composition as the first anisotropically-shaped powder, a mixture of a K-containing compound and an Na-containing compound blended in a stoichiometric ratio to form KNN from the anisotropically-shaped powder A and the first reaction material may be used as the first reaction material.

Further, in the case of producing grain oriented ceramics having the KNN composition, for example, by using a second anisotropically-shaped powder having the composition represented by the chemical formula 1 as the first anisotropically-shaped powder, a mixture of a K-containing compound and an Na-containing compound blended in a stoichiometric ratio to form KNN and $Bi_2O_3$ from the second anisotropically-shaped powdernd the first reaction material may be used as the first reaction material.

In the mixing step, a fine powder with an indefinite shape constituted of a compound having the same composition as the first perovskite-type alkali-pentavalent metal oxide compound obtained by the reaction of the first anisotropically-shaped powder and the first reaction material (hereinafter, referred to as "fine compound powder"), and/or sintering additive (for example, CuO) may also be added to the first anisotropically-shaped powder and the first reaction material blended at a predetermined ratio. When the fine compound powder or the sintering additive is added to the first anisotropically-shaped powder and the first reaction material, the sintered body can be densified easily.

Further, in the case of mixing the fine compound powder, when the blending ratio of the fine compound powder is excessive, the blending ratio of the first anisotropically-shaped powder in the entire starting material inevitably decreases, whereby the orientation degree of the resultant grain oriented ceramics may possibly decrease. Accordingly, it is preferred that an optimum blending ratio of the fine compound powder be selected in accordance with the required sintered density and the degree of the orientation.

The blending ratio of the first anisotropically-shaped powder should be determined so that the ratio at which one or more ingredient elements in the first anisotropically-shaped powder occupies the A site of the first perovskite-type alkali-pentavalent metal oxide compound represented by $ABO_3$ is preferably 0.01 to 70 at %, and more preferably 0.1 to 50 at %.

Further, mixing of the first anisotropically-shaped powder and the first reaction material, as well as the fine compound powder and the sintering additive mixed as necessary may be conducted in a dry process or in a wet process by adding an appropriate dispersion medium such as water or alcohol. Further, at this point, a binder and/or a plasticizer may also be added as required.

Then, the molding step is to be described. In the molding step, the mixture obtained in the mixing step is molded such that the first anisotropically-shaped powder is oriented. In this case, it may be molded such that the first anisotropically-shaped powder is plane-oriented or, alternatively, it may be molded such that the first anisotropically-shaped powder is axially oriented.

There is no particular restriction on the molding process so long as the first anisotropically-shaped powder can be oriented. Preferred examples of the molding method for plane-orienting the first anisotropically-shaped powder may specifically include the doctor blade method, the uniaxial pressing method, the roll-pressing method, and the like. Further, preferred examples of the molding method for axially orienting the first anisotropically-shaped powder specifically may include the extrusion method, the centrifugal forming method, and the like.

Further, for increasing the thickness and improving the degree of orientation of the green body in which the first anisotropically-shaped powder is plane-oriented (hereinafter, referred to as "plane-oriented green body"), a treatment such as lamination forming, uniaxial pressing or roll-pressing (hereinafter, referred to as the "plane-orientation treatment") may further be applied. In this case, one of the plane-orientation treatments or two or more of plane-orientation treatments may be applied to the plane-oriented-green body. Alternatively, a single type of the plane-orientation treatment may be applied repetitively more than once, or two or more-types of plane-orientation treatments may be repeated individually more than once.

Then, the heat treatment step is to be described. In the heat treatment step, the green body obtained in the molding step is heated, and the first anisotropically-shaped powder and the first reaction material are reacted. When a green body containing the first anisotropically-shaped powder and the first reaction material is heated to a predetermined temperature, the first perovskite-type alkali-pentavalent metal oxide compound is formed by their reaction, and sintering the first perovskite-type alkali-pentavalent metal oxide compound thus formed simultaneously proceeds. Further, depending on the composition of the first anisotropically-shaped powder and/or first reaction material, a surplus ingredient is formed simultaneously.

An optimum heating temperature is selected in accordance with the composition of the first anisotropically-shaped powder and the first reaction material to be used and the composition of the grain oriented ceramics to be produced, so that the reaction and/or sintering efficiently proceed, and so that the reaction product having the aimed composition is formed.

For example, in the case of producing the grain oriented ceramics having the KNN composition by using an anisotropically-shaped powder A having the KNN composition, the heating temperature is preferably 900° C. or higher and 1300° C. or lower. Heating in this case may be conducted in any atmosphere such as in air, in oxygen, under a reduced pressure, or under vacuum. Further, an optimum heating time may be selected in accordance with the heating temperature to obtain a predetermined sintered density.

Further, in the case where a surplus ingredient is formed by the reaction of the first anisotropically-shaped powder and the first reaction material, the surplus ingredient may remain as a sub-phase in the sintered body, or the surplus ingredient may be removed from the sintered body. Removing the surplus ingredient may be conducted under a thermally removing method and a chemically removing method.

Under the thermally removing method, a sintered body in which the first perovskite-type alkali-pentavalent metal oxide compound and a surplus ingredient are formed (hereinafter, referred to as "intermediate sintered body") is heated up to a predetermined temperature, thereby evaporating the surplus ingredient. Specifically, preferred examples may include a method of heating the intermediate sintered body in a reduced pressure or in vacuum at a temperature causing evaporation of the surplus ingredient, a method of heating the intermediate sintered body in air or in oxygen for a long time at a temperature causing evaporation of the surplus ingredient, and the like.

An optimum heating temperature upon thermally removing the surplus ingredient may be selected in accordance with the composition of the first perovskite-type alkali-pentavalent metal oxide compound and the surplus ingredient so that evaporation of the surplus ingredient is efficiently proceeds, and formation of a by-products is suppressed. For example, in the case where the first perovskite-type alkali-pentavalent metal oxide compound has the KNN single phase, and the surplus ingredient has a bismuth oxide single phase, the heating temperature is preferably 800° C. or higher and 1300° C. or lower, and more preferably 1000° C. or higher and 1200° C. or lower.

Under the method of chemically removing the surplus ingredient, the intermediate sintered body is immersed in a treating solution having a nature of chemically dissolving only the surplus ingredient, thereby leaching the surplus ingredient. An optimum treating liquid to be used may be selected in accordance with the composition of the first perovskite-type alkali-pentavalent metal oxide compound and the surplus ingredient. For example, in the case where the first perovskite-type alkali-pentavalent metal oxide compound has the KNN single phase, and the surplus ingredient has a bismuth oxide single phase, an acid such as a nitric acid or a hydrochloric acid is preferably used-as the treating liquid. Particularly, the nitric acid is suitable as a treating liquid for chemically extracting the surplus ingredient mainly constituted of bismuth oxide.

Reaction of the first anisotropically-shaped powder and the first reaction material and removal of the surplus ingredient may be conducted at any timing. That is, they may be conducted simultaneously, sequentially or individually. For example, the green body may be placed under a reduced pressure or vacuum and be heated directly to such a temperature at which both the reaction of the first anisotropically-shaped powder and the first reaction material and the evaporation of the surplus ingredient proceed efficiently, and the surplus ingredient may be removed simultaneously with the reaction.

Further, the green body may be heated, for example, in air or in oxygen at such a temperature at which the reaction of the first anisotropically-shaped powder and the first reaction material proceeds efficiently to form an intermediate sintered body, and the intermediate sintered body may successively be heated under a reduced pressure or vacuum at such a temperature at which evaporation of the surplus ingredient proceeds efficiently, thereby removing the surplus ingredient. Alternatively, after forming the intermediate sintered body, the intermediate sintered body may be successively heated in air or in oxygen at such a temperature at which evaporation of the surplus ingredient proceeds efficiently for a long time, thereby removing the surplus ingredient.

Further, for example, after forming the intermediate sintered body and cooling it to room temperature, the intermediate sintered body may be immersed in a treating liquid, thereby chemically removing the surplus ingredient. Alternatively, after forming the sintered body and cooling the same to room temperature, the intermediate body is again heated in a predetermined atmosphere to a predetermined temperature, thereby thermally removing the surplus ingredient.

In the case of a green body containing a binder, a heat treatment may be applied mainly with a purpose of dewaxing before the heat treatment step. In this case, the dewaxing temperature should be high enough to thermally decompose the binder.

Further, when the oriented green body is dewaxed, the orientation degree of the first anisotropically-shaped powder in the oriented green body may possibly decrease, or volumic expansion of the oriented green body may occur. In such a case, a cold isostatic pressing (CIP) treatment is preferably applied to the oriented green body before conducting the heat treatment. When the CIP is further applied to the green body having been dewaxed, it is possible to suppress a decrease in the orientation degree caused by dewaxing or a decrease in the sintered density due to volumic expansion of the oriented green body.

Further, when the surplus ingredient is removed in the case where the surplus ingredient is formed by the reaction of the first anisotropically-shaped powder and the first reaction material, the CIP may be further applied to the intermediate sintered body in which the surplus ingredient has been removed, and the product may be sintered again. Moreover, for additionally improving the density and the orientation degree of the sintered body, a method of further conducting hot pressing to the sintered body after the heat treatment is also effective. In addition, a process of adding the fine compound powder, the CIP treatment and hot pressing may be used in combination.

Then, the function of a production process of the grain oriented ceramics according to this invention is to be described. When the first anisotropically-shaped powder and the first reaction material are mixed and then molded by a molding method of exerting a force from a direction with respect to the first anisotropically-shaped powder, the first anisotropically-shaped powder is oriented in the green body by the shear stress exerting on the first anisotropically-shaped powder. When such a green body is heated at a predetermined temperature, the first anisotropically-shaped powder and the first reaction material are reacted to form the first perovskite-type alkali-pentavalent metal oxide compound.

At this point, since there is a lattice matching between the developed plane of the anisotropically-shaped powder and the specified crystal plane of the first perovskite-type alkali-pentavalent metal oxide compound, the developed plane of the first anisotropically-shaped powder is succeeded as the specified crystal plane of the first perovskite-type alkali-pentavalent metal oxide compound thus formed. Accordingly, anisotropically-shaped grains of the first perovskite-type alkali-pentavalent metal oxide compound are formed in the sintered body in a state where the specified crystal plane is oriented in one direction.

In the conventional process of forming only the isotropic perovskite type compound by using the anisotropically-shaped powder constituted of the layered perovskite type compound as the reactive template, only the grain oriented ceramics or the anisotropically-shaped powder constituted of the isotropic perovskite compound containing all the A-site elements and the B-site elements contained in the anisotropically-shaped powder and other materials can be produced.

On the other hand, it is necessary that the material of the anisotropically-shaped powder used as the reactive template has large anisotropy of the crystal lattice and lattice matching with the isotropic perovskite type compound. However, depending on the composition of the isotropic perovskite type compound to be produced, materials satisfying such conditions do not exist, or searching such materials is sometimes extremely difficult. Accordingly, in the conventional process, there has been a limit to the control of the composition of the resultant grain oriented ceramics or the anisotropically-shaped powder, particularly to the control of the composition of the A-site element.

On the other hand, the first process of this invention is carried out in the following steps: An anisotropically-shaped powder A constituted of the second perovskite-type alkali-pentavalent metal oxide compound is synthesized by using a second anisotropically-shaped powder constituted of a layered perovskite type compound for easily synthesizing an anisotropically-shaped powder as the reactive template; grain oriented ceramics is produced by using the anisotropically-shaped powder A as the reactive template. Under this process, grain oriented ceramics in which an arbitrary crystal plane is oriented can be easily and cost-effectively produced even from the first perovskite-type alkali-pentavalent metal oxide compound having small anisotropy of a crystal lattice.

In addition, when the composition of the second anisotropically-shaped powdernd the second reaction material is optimized, even an anisotropically-shaped powder A not containing the surplus A-site element can be synthesized. Accordingly, control over the composition of the A-site element can be facilitated compared with the conventional process, and it is possible to obtain even grain oriented ceramics including the first perovskite-type alkali-pentavalent metal oxide compound, as the main phase, having the composition not obtainable by the conventional process.

Further, according to the second process of using a second anisotropically-shaped powder constituted of a layered perovskite type compound as the first anisotropically-shaped powder, the first perovskite-type alkali-pentavalent metal oxide compound can be synthesized simultaneously with sintering. Further, when the composition of the second anisotropically-shaped powder oriented in the green body and the first reaction material to be reacted therewith is optimized, the surplus A-site element can be discharged as the surplus ingredient from the second anisotropically-shaped powder simultaneously with the synthesis of the first perovskite-type alkali-pentavalent metal oxide compound.

Further, in the case of using the second anisotropically-shaped powder forming a surplus ingredient, which can be easily removed thermally or chemically, as the first anisotropically-shaped powder, it is possible to obtain grain oriented ceramics not substantially containing the surplus A-site element, constituted of the first perovskite-type alkali-pentavalent metal oxide compound, and having the specified oriented crystal plane.

EXAMPLE 1

A platelike powder having NN composition was synthesized in accordance with the following procedures. First, a $Bi_2O_3$ powder, an $Na_2CO_3$ powder and an $Nb_2O_5$ powder were weighed so as to provide BINN2 composition at a stoichiometric ratio, and these powders were wet-blended. Subsequently, NaCl was added to those materials by 50 wt % as a flux, and they were dry-blended for one hour. Then, the resultant mixture was placed in a platinum crucible and heated under the condition at 850° C.×1 hr, so that the flux was melt completely. Thereafter, it was further heated under the condition at 1050° C.×1 hr to synthesize BINN2. The heating rate and the cooling rate were both set at 200° C./hr.

After cooling, the flux was removed from the reaction product with a hot water bath to obtain a BINN2 powder. The resultant BINN2 powder was a platelike powder with the {001} plane as its developed plane. Further, the powder had an average aspect ratio of 3 to 5 and an average particle size of 5 to 10 μm.

Next, the BINN2 platelike powder and the $Na_2CO_3$ powder were weighed so as to provide NN composition at a stoichiometrical ratio, and they were wet-blended. Subsequently, NaCl was added by 50 wt % as a flux, and the mixture was dry-blended for one hour. Further, the resultant mixture was placed in a platinum crucible and treated with heat under the condition at 850° C.×8 hr. The heating rate and the cooling rate were both set at 200° C./hr.

Since the resultant reaction product contains $Bi_2O_3$ in addition to the NN powder, after the flux is removed, the reaction product was placed into $HNO_3$ (1N) to dissolve $Bi_2O_3$ having been formed as a surplus ingredient. Further, the solution was filtered to separate the NN powder, which was then washed with ion-exchanged water at 80° C. The resultant NN powder was a platelike powder with the {100} plane as its developed plane. Further, the powder had an average aspect ratio of 3 to 10 and an average grain size of 1 to 10 μm.

EXAMPLE 2

A platelike powder of KNN composition was synthesized using the following procedures. First, a BINN2 platelike powder was synthesized through the same steps as in the first stage of Example 1. Then, a KNN powder was synthesized through the same steps as in the latter stage of Example 1, except that the BINN2 platelike powder, an $Na_2CO_3$ powder and a $K_2CO_3$ powder were weighed so as to provide KNN composition at a stoichiometric ratio. The resultant KNN powder was a platelike powder with the {100} plane as its developed plane. Further, the powder had an average aspect ratio of 3 to 10 and an average particle size of 1 to 10 μm.

EXAMPLE 3

A platelike powder of NN composition was synthesized using the following procedures. First, a BINN5 platelike powder was synthesized through the same steps as in the first stage of Example 1, except that a $Bi_2O_3$ powder, an $Na_2CO_3$ powder and an $Nb_2O_5$ powder were weighed so as to provide $Bi_{2.5}Na_{3.5}Nb_5O_{18}$ (hereinafter referred to as "BINN5") composition at a stoichiometric ratio. Then, an NN powder was synthesized through the same steps as in the latter stage of Example 1, except that the BINN5 platelike powder and an $Na_2CO_3$ powder were weighed so as to provide NN composition at a stoichiometric ratio.

Figure 2:
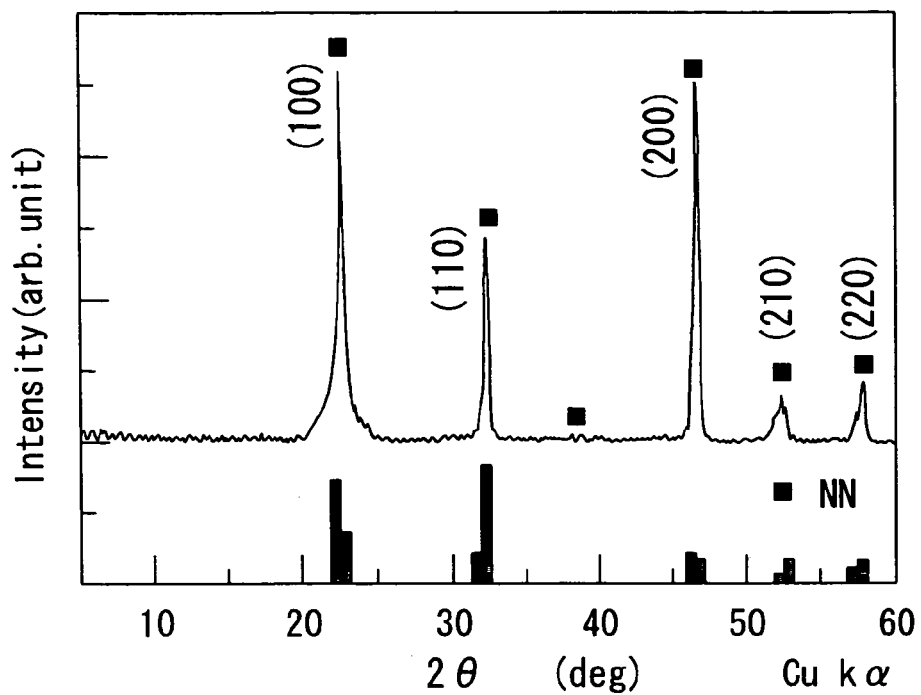
FIG. 2 is a view showing an X-ray diffraction pattern of the NN platelike powder obtained in Example 3.

FIG. 1 is an SEM image of the resultant powder, and FIG. 2 is a view showing an X-ray diffraction pattern of the resultant powder. The resultant powder has an NN single phase, and was a platelike powder with the {100} plane as its developed plane. Further, the powder had an average aspect ratio of 10 to 20 and an average particle size of 5 to 10 μm.

EXAMPLE 4

A platelike powder of KNN composition was synthesized using the following procedures. First, a BINN5 platelike powder was synthesized through the same steps as in the first stage of Example 1, except that a $Bi_2O_3$ powder, a $Na_2CO_3$ powder and a $Nb_2O_5$ powder were weighed so as to provide BINN5 composition at a stoichiometric ratio. Then, a KNN powder was synthesized through the same steps as in the latter stage of Example 1, except that the BINN5 platelike powder, a $Na_2CO_3$ powder, a $K_2CO_3$ powder, and a $Nb_2O_5$ powder were weighed so as to provide KNN composition at a stoichiometric ratio. The resultant KNN powder was a platelike powder with the {100} plane as its developed plane. Further, the powder had an average aspect ratio of 10 to 30 and an average particle size of 5 to 10 μm.

EXAMPLE 5

A platelike powder having $KNbO_3$ (hereinafter referred to as "KN") composition was synthesized in accordance with the following procedures. First, a $Bi_2O_3$ powder, an $K_2CO_3$ powder and an $Nb_2O_5$ powder were weighed so as to provide $Bi_{2.5}K_{0.5}Nb_2O_9$ composition at a stoichiometric ratio, and these powders were wet-blended. Subsequently, KCl was added to those materials by 50 wt % as a flux, and they were dry-blended for one hour. Then, the resultant mixture was placed in a platinum crucible and heated under the condition at 800° C.×1 hr, so that the flux was melt completely. Thereafter, it was further heated under the condition at 900° C.×1 hr to synthesize BINN2. The heating rate and the cooling rate were both set at 200° C./hr.

After cooling, the flux was removed from the reaction product with a hot water bath to obtain a BIKN2 powder. The resultant BIKN2 powder was a platelike powder with the {001} plane as its developed plane. Further, the powder had an average aspect ratio of 3 to 5 and an average particle size of 5 to 10 μm.

Next, the BIKN2 platelike powder and the $K_2CO_3$ powder were weighed so as to provide KN composition at a stoichiometrical ratio, and they were wet-blended. Subsequently, KCl was added by 50 wt % as a flux, and the mixture was dry-blended for one hour. Further, the resultant mixture was placed in a platinum crucible and treated with heat under the condition at 800° C.×8 hr. The heating and cooling rates were both set at 200° C./hr.

Since the resultant reaction product contains $Bi_2O_3$ in addition to the KN powder, $Bi_2O_3$ was removed from the reaction product to obtain a KN powder through the same steps as in the latter stage of Example 1. The KN powder was a platelike powder with the {100} plane as its developed plane. Further, the powder had an average aspect ratio of 3 to 10 and an average particle size of 1 to 10 μm.

EXAMPLE 6

Using the NN platelike powder obtained in Example 3, grain oriented ceramics composed of KNN as the main phase were produced. First, the NN platelike powder obtained in Example 3 and a non-platelike KN powder were blended at a mole ratio of 1:1, and they were wet-blended for 20 hours.

After the blending, a binder (Eslec BH-3, manufactured by Sekisui Chemical Co.), a plasticizer (butyl phthalate) and a sintering additive (CuO) were added to the slurry by 10.35 g, 10.35 g and 0.795 g respectively, relative to 1 mol of KNN to be synthesized in the sintered body, and they were further blended for one hour.

In this case, the non-platelike KN powder was prepared according to the solid-state reaction method, in which a mixture of a $K_2CO_3$ powder and a $Nb_2O_5$ powder was heated at 800° C. for four hours, and the reaction product was pulverized in a ball mill.

Then, the slurry was formed into tapes of 100 μm thickness using a doctor blade technique. Further, the tapes were laminated, uniaxially pressed and roll-pressed to obtain a platelike green body of 1.5 mm thickness. Then, the resultant platelike green body was dewaxed in air under the conditions at a heating temperature of 600° C., for a heating time of two hours, at a heating rate of 50° C./hr, and at a cooling rate of furnace cooling. Further, the platelike green body was subjected to a CIP treatment at a pressure of 300 MPa, and then it was sintered in air at 1100° C. or 1125° C. for 10 hours.

The {100} plane of KNN in the resultant grain oriented ceramics was oriented in parallel to the tape plane, and the orientation degree F{100} plane by the Lotgering's method was 43% for the sintered body obtained at the heating temperature of 1100° C., and 64% for the sintered body at the heating temperature of 1125° C.

EXAMPLE 7

Using the NN platelike powder obtained in Example 3, grain oriented ceramics composed of KNN as the main phase were produced through the same steps as in Example 6, except that the NN platelike powder, a non-platelike KN powder and a non-platelike KNN powder were blended at a mole ratio of 1:1:3. In this case, the non-platelike KNN powder and the non-platelike KN powder were prepared according to the solid-state reaction method, in which mixtures of $K_2CO_3$, $Na_2CO_3$ and $Nb_2O_5$ powders were heated at 800° C. for four hours, and the reaction products were pulverized in a ball mill, respectively.

The {100} plane of KNN in the resultant grain oriented ceramics was oriented in parallel to the tape plane, and the orientation degree F{100} plane by the Lotgering's method was 30% for the sintered body obtained at the heating temperature of 1100° C., and 38% for the sintered body at the heating temperature of 1125° C.

EXAMPLE 8

Using the NN platelike powder obtained in Example 3, grain oriented ceramics composed of KNN as the main phase were produced through the same steps as in Example 6, except that the NN platelike powder, a $K_2CO_3$ powder and an $Nb_2O_5$ powder were blended at a mole ratio of 2:1:1.

The {100} plane of KNN in the resultant grain oriented ceramics was oriented in parallel to the tape plane, and the orientation degree F{100} plane by the Lotgering's method was 36% for the sintered body at the heating temperature of 1100° C.

EXAMPLE 9

Using the NN platelike powder obtained in Example 3, grain oriented ceramics composed of KNN as the main phase were produced through the same steps as in Example 6, except that the NN platelike powder, a non-platelike NN powder and a non-platelike KN powder were blended at a mole ratio of 1:1:2. In this case, the non-platelike NN powder and the non-platelike KN powder were prepared according to the solid-state reaction method, in which mixtures of $Na_2CO_3$, $K_2CO_3$ and $Nb_2O_5$ powders were heated at 800° C. for four hours, and the reaction products were pulverized in a ball mill, respectively.

The {100} plane of KNN in the resultant grain oriented ceramics was oriented in parallel to the tape plane, and the orientation degree F{100} plane by the Lotgering's method was 40% for the sintered body obtained at the heating temperature of 1125° C. Further, the sintered body was machined into a disc with a diameter of 11 mm and a thickness of 0.7 mm. Gold electrodes were sputter-deposited on the planar surfaces of the disc, and the disc specimen was poled. In this case, the planar surfaces of the disc were a plane parallel to a tape plane of sintered body. Then, piezoelectric $g_{31}$ constant and piezoelectric $d_{31}$ constant were measured by the resonance-antiresonance method. As a result, a value of $g_{31}$ was $10.7\times10^{-3}$ Vm/N, and a value of $d_{31}$ was 34.6 pm/V. The value of $d_{31}$ was about 1.2 times larger than those of a non-oriented KNN sintered body (Comparative Example 1), which is described later.

EXAMPLE 10

Using the NN platelike powder obtained in Example 3, grain oriented ceramics composed of KNN as the main phase were produced through the same steps as in Example 9, except that sintering was conducted for 20 hours.

The {100} plane of KNN in the resultant grain oriented ceramics was oriented in parallel to the tape plane, and the orientation degree F{100} plane by the Lotgering's method was 30% for the sintered body obtained at the heating temperature of 1125° C. Further, the disc specimen was produced through the same steps as in Example 9 to measure piezoelectric $g_{31}$ constant and a piezoelectric $d_{31}$ constant. The disc specimen was poled, and the piezoelectric $g_{31}$ constant and the piezoelectric $d_{31}$ constant were measured by the resonance-antiresonance method. As a result, a value of $g_{31}$ was $9.7\times10^{-3}$ Vm/N, and a value of $d_{31}$ was 44.7 pm/V. The value of $d_{31}$ was about 1.5 times larger than those of a non-oriented KNN sintered body (Comparative Example 1), which is described later.

EXAMPLE 11

Using the NN platelike powder obtained in Example 3, grain oriented ceramics composed of KNN as the main phase were produced through the same steps as in Example 9, except that the NN platelike powder, a non-platelike NN powder and a non-platelike KN powder were blended at a mole ratio of 1:9:10 and that sintering was conducted for five hours. In this case, the non-platelike NN powder and the non-platelike KN powder were prepared according to the solid-state reaction method, in which mixtures of $Na_2CO_3$, $K_2CO_3$ and $Nb_2O_5$ powders were heated at 800° C. for four hours, and the reaction products were pulverized in a ball mill, respectively.

Figure 3:
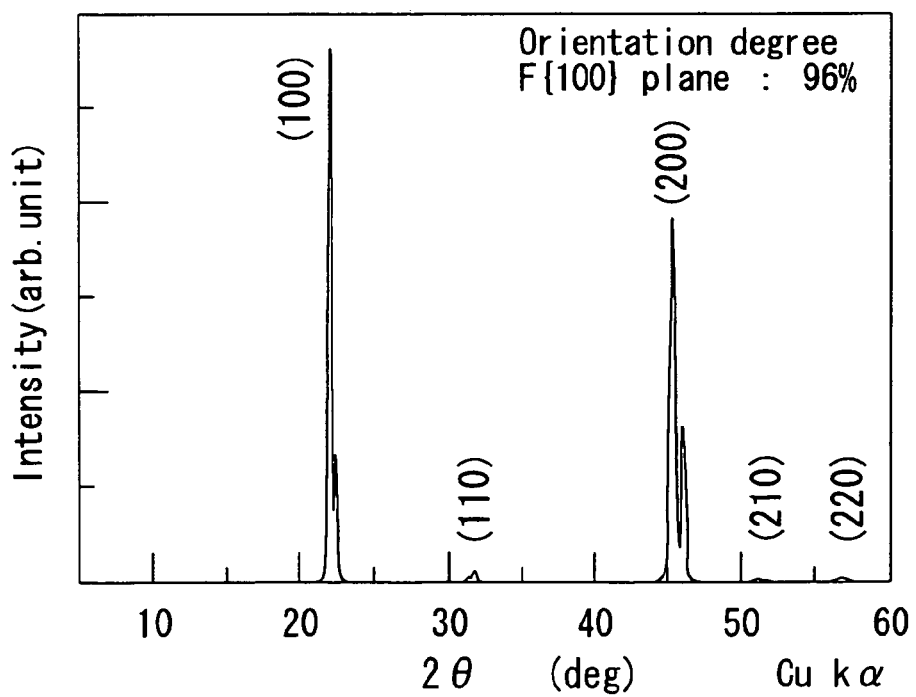
FIG. 3 is a view showing an X-ray diffraction pattern measured on a plane parallel to a tape plane of grain oriented ceramics obtained in Example 11.

The {100} plane of KNN in the resultant grain oriented ceramics was oriented in parallel to the tape plane, and the orientation degree F{100} plane by the Lotgering's method was 96% for the sintered body obtained at the heating temperature of 1100° C. FIG. 3 shows an X-ray diffraction pattern measured on a plane parallel to the tape plane of the grain oriented ceramics obtained in this example.

Further, the disc specimen was produced through the same steps as in Example 9 to measure piezoelectric $g_{31}$ constant and a piezoelectric $d_{31}$ constant. The disc specimen was poled, and the piezoelectric $g_{31}$ constant and the piezoelectric $d_{31}$ constant were measured by the resonance-antiresonance method. As a result, a value of $g_{31}$ was $22.5\times10^{-3}$ Vm/N, and a value of $d_{31}$ was 41.3 pm/V. The values of $g_{31}$, and $d_{31}$, were about 1.6 times and 1.4 times, respectively, larger than those of a non-oriented KNN sintered body (Comparative Example 1), which is described below.

COMPARATIVE EXAMPLE 1

Non-oriented ceramics composed of KNN as the main phase were produced through the same steps as in Example 6, except that only the KNN powder synthesized by the solid-state reaction method was used. The orientation degree F{100} plane of the resultant non-oriented ceramics by the Lotgering's method was 0% irrespective of heating temperature. Further, the piezoelectric voltage sensor g coefficient ($g_{31}$) was $13.9\times10^{-3}$ Vm/N for the sintered body at the heating temperature of 1100° C. In addition, the piezoelectric distortion constant ($d_{31}$) was 29.2 pm/v for the sintered body at the heating temperature of 1100° C.

Table 1 shows sintering conditions and properties of the sintered bodies obtained in Examples 9, 10, 11 and Comparative Example 1.

TABLE 1

| | Sintering conditions | | | Properties of sintered body | | |
|---|---|---|---|---|---|---|
| | Temperature (° C.) | Sintering time (hr) | Atmosphere | Orientation degree (%) | $d_{31}$ (pm/V) | $g_{31}$ ($10^{-3}$ Vm/N) |
| Example 9 | 1125 | 10 | Air | 40 | 34.6 | 10.7 |
| Example 10 | 1125 | 20 | Air | 30 | 44.7 | 9.7 |
| Example 11 | 1100 | 5 | Air | 96 | 41.3 | 22.5 |
| Comparative Example 1 | 1100 | 1 | Air | 0 | 29.2 | 13.9 |

Preferred embodiments of this invention have been described in detail, but this invention is not limited thereto and various modifications may be made without departing from the spirit and scope thereof.

For example, while the above examples have given descriptions mainly of the example of applying this invention to the perovskite-type alkali-pentavalent metal oxide compound containing Nb as a pentavalent metal, this invention is also applicable in the same manner to those containing Sb or Ta as the pentavalent metal, or those containing two or more of pentavalent metals among Nb, Sb and Ta.

Further, in the foregoing examples, heat treatment is applied at atmospheric pressure during the production of grain oriented ceramics. However, after the heat treatment a hot press or HIP treatment may also be applied to the sintered body to obtain dense grain oriented ceramics.

Further, while the anisotropically-shaped powder A according to this invention is suitable particularly as a reactive templete for producing grain oriented ceramics according to this invention, the use of the anisotropically-shaped powder A according to this invention is not limited only thereto and it may also be used as a powder for piezoelectric rubber composite materials.

Further, the above embodiments have given descriptions mainly of the grain oriented ceramics composed of a perovskite-type alkali-pentavalent metal oxide compound suitable as a piezoelectric material and the anisotropically-shaped powder A, as well as the production processes thereof. However, it is possible to impart thermoelectric properties or ionic conduction properties to the perovskite-type alkali-pentavalent metal oxide compound by adding an appropriate sub-ingredient and/or sub-phase thereto. Accordingly, the process according to this invention may be applied to produce grain oriented ceramics and anisotropically-shaped powder A which are also suitable as thermoelectric materials or ionic conduction materials.

The foregoing description of the preferred embodiments of the invention has been presented for purposes of illustration and description. It is not intended to be exhaustive or to limit the invention to the precise form disclosed, and modifications and variations are possible in the light of the above teachings or may be acquired from practice of the invention. The embodiments chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An anisotropically-shaped powder with perovskite crystal structure comprising an alkali-pentavalent metal oxide compound represented by a general formula: $ABO_3$, wherein a main ingredient for an A-site element is K and/or Na and a main ingredient for a B-site element is Nb, Sb and/or Ta, with a specific crystal plane as its developed plane, with a platelike or flaky shape, and with an average aspect ratio of 3 or more.

2. The anisotropically-shaped powder according to claim 1, wherein the specific crystal plane is a pseudo-cubic {100} plane, a pseudo-cubic {110} plane, or a pseudo-cubic {111} plane.

3. The anisotropically-shaped powder according to claim 1, of which average particle size is 0.05 μm to 20 μm inclusive.

4. The anisotropically-shaped powder according to claim 1, wherein the average aspect ratio is 5 or more.

5. The anisotropically-shaped powder according to claim 1, wherein the average aspect ratio is 10 or more.

6. The anisotropically-shaped powder according to claim 1, wherein the average aspect ratio is in a range of 3 to 100.

7. The anisotropically-shaped powder according to claim 1, wherein a sub-ingredient for the A-site element is $Li^+$, $Ag^+$ or $Cs^+$.

* * * * *